United States Patent [19]

Hutter et al.

[11] Patent Number: 5,702,959
[45] Date of Patent: Dec. 30, 1997

[54] METHOD FOR MAKING AN ISOLATED VERTICAL TRANSISTOR

[75] Inventors: Louis N. Hutter, Richardson; Jeffrey P. Smith, Plano, both of Tex.

[73] Assignee: Texas Instruments Incorporated, Dallas, Tex.

[21] Appl. No.: 455,945

[22] Filed: May 31, 1995

[51] Int. Cl.⁶ .................................. H01L 21/265
[52] U.S. Cl. .................. 437/31; 437/52; 437/59; 437/75; 437/153; 148/DIG. 30; 148/DIG. 39; 148/DIG. 109; 257/370
[58] Field of Search .................. 437/31, 59, 52, 437/75, 153; 148/DIG. 39, DIG. 30, DIG. 109; 257/370

[56] References Cited

U.S. PATENT DOCUMENTS

| | | | |
|---|---|---|---|
| Re. 30,282 | 5/1980 | Hunt et al. | 437/31 |
| 3,892,596 | 7/1975 | Bjorklund et al. | 437/31 |
| 3,971,059 | 7/1976 | Dunkley et al. | 437/31 |
| 4,001,869 | 1/1977 | Brown | 437/31 |
| 4,021,270 | 5/1977 | Hunt et al. | 437/31 |
| 4,106,049 | 8/1978 | Shinozaki et al. | 437/31 |
| 4,131,497 | 12/1978 | Feng et al. | 437/31 |
| 4,343,080 | 8/1982 | Hataishi et al. | 437/31 |
| 4,357,622 | 11/1982 | Magdo et al. | 437/31 |
| 4,404,738 | 9/1983 | Sasaki et al. | 437/31 |
| 4,408,387 | 10/1983 | Kiriseko | 437/31 |
| 4,543,707 | 10/1985 | Ito et al. | 437/31 |
| 4,577,397 | 3/1986 | Komatsu et al. | 437/31 |
| 4,622,738 | 11/1986 | Gwozdz et al. | 437/31 |
| 4,648,909 | 3/1987 | Krishina et al. | 437/31 |
| 4,855,244 | 8/1989 | Hutter et al. | 437/31 |
| 4,874,712 | 10/1989 | Kim et al. | 437/31 |
| 4,889,824 | 12/1989 | Selle et al. | 437/31 |
| 4,898,836 | 2/1990 | Zambrano et al. | 437/31 |
| 4,902,633 | 2/1990 | Cambou | 437/31 |
| 5,066,602 | 11/1991 | Takemoto et al. | 437/31 |
| 5,132,234 | 7/1992 | Kim et al. | 437/31 |
| 5,198,373 | 3/1993 | Yoshino | 437/31 |
| 5,208,171 | 5/1993 | Ohmi | 437/31 |
| 5,254,485 | 10/1993 | Segawa et al. | 437/31 |
| 5,300,451 | 4/1994 | Zambrano | 437/31 |
| 5,302,534 | 4/1994 | Monk et al. | 437/31 |
| 5,348,895 | 9/1994 | Smayling et al. | 437/54 |
| 5,389,563 | 2/1995 | Kuroi et al. | 437/31 |
| 5,409,843 | 4/1995 | Yamauchi et al. | 437/31 |
| 5,416,031 | 5/1995 | Miwa | 437/31 |

OTHER PUBLICATIONS

*Analysis and Design of Analog Integrated Circuits*, Third Edition, Gray and Meyer, John Wiley & Sons, Inc. pp. 148–149, 1993.

*Primary Examiner*—John Niebling
*Assistant Examiner*—Long Pham
*Attorney, Agent, or Firm*—W. Daniel Swayze; W. James Brady, III; Richard L. Donaldson

[57] ABSTRACT

A process for making a vertical PNP transistor and a transistor made by the process includes providing a highly doped semiconductor substrate (10) of P conductivity type. A first lightly doped P– layer (12) is epitaxially grown on the substrate (10). An N+ type buried layer impurity (18) is introduced into a surface region of the first lightly doped layer (12) that will underlie and define an island in which the vertical transistor will be constructed. A second lightly doped P– layer (16) is epitaxially grown on the first lightly doped layer (12) and the buried layer impurity (18). An N+ type isolation impurity is diffused into the second layer to form wells to laterally enclose an island (22) of the second layer (16) above the buried layer impurity (18). An N type base impurity (28) is diffused into the island (22) region of the second layer (16), and a P type emitter impurity (30) is diffused into the base region (28). A collector resistivity adjusting impurity (25) may optionally be diffused into the second layer (16) to reduce the collector resistance of the PNP transistor that is formed. Various steps in the construction of the vertical PNP transistor, such as diffusing the isolation impurity (18), diffusing the base impurity (28), and diffusing the emitter impurity (30), may be performed simultaneously with corresponding steps of a BiCMOS process.

16 Claims, 6 Drawing Sheets

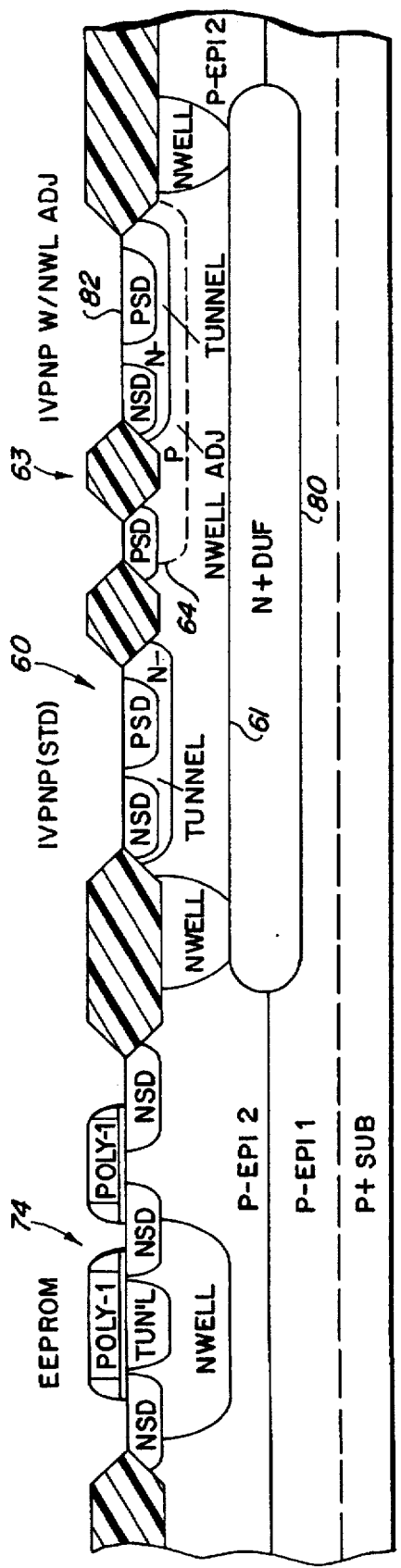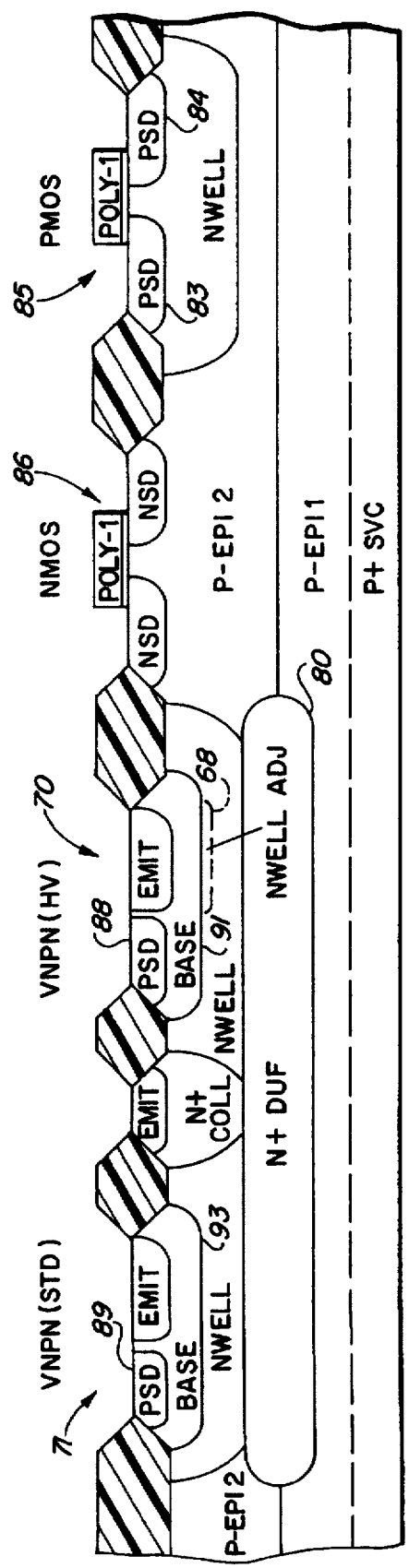
Fig. 4a
Fig. 4b

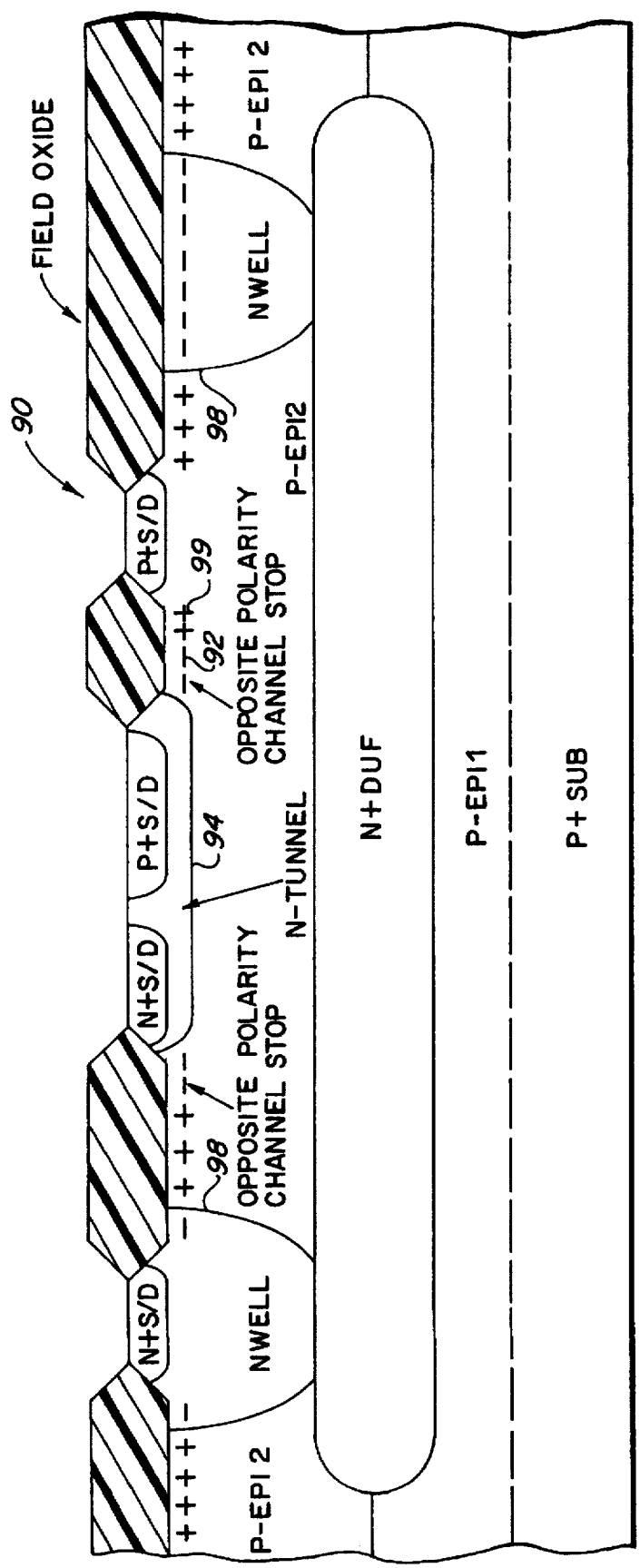

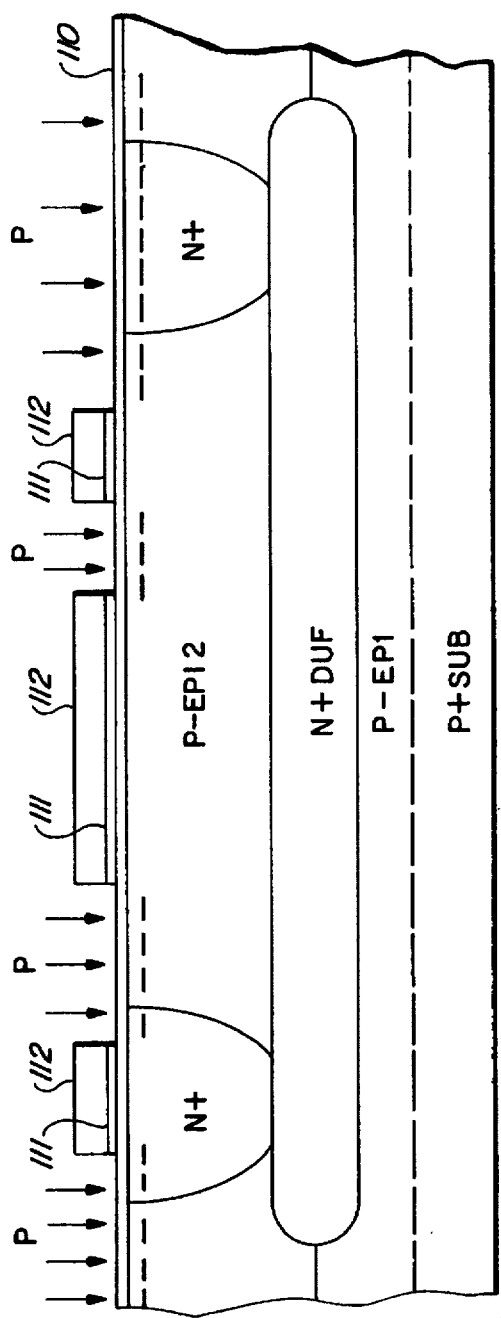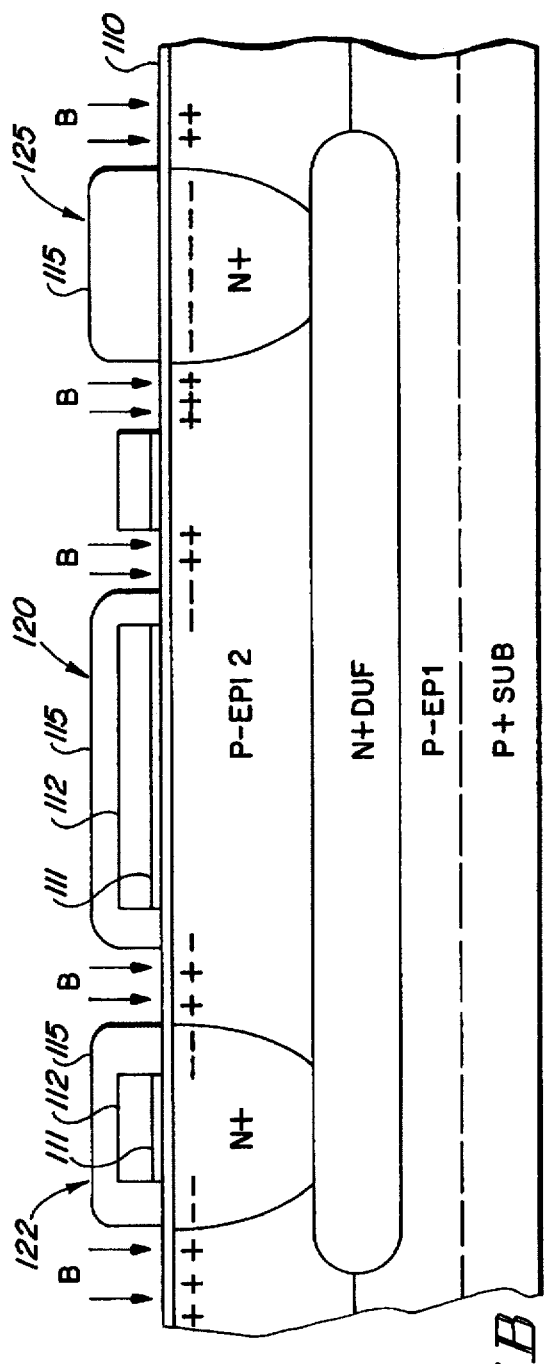

METHOD FOR MAKING AN ISOLATED VERTICAL TRANSISTOR

BACKGROUND OF THE INVENTION

1. Field of the Invention

This invention relates to improvements in semiconductor integrated circuit fabrication processes, or the like, and to devices made thereby, and more particularly to improvements in processes for fabricating vertical bipolar transistor devices, and vertical bipolar transistor devices made thereby, and still more particularly to improvements in processes for making vertical PNP transistors, which may be performed in conjunction with other semiconductor fabrication processes, especially BiCMOS and related processes, and vertical PNP transistors made thereby.

2. Relevant Background

Many mixed-signal BiCMOS processes today are based on N well CMOS, BiCMOS, LinCMOS™, or LinBiC-MOS™ starting processes. In linear mixed-signal device fabrication processes, it is often necessary to used isolated complementary, or CMOS, devices in the designs to be accomplished. In many linear applications, however, bipolar devices are preferable to CMOS devices, due to the higher transconductance, improved noise performance, and voltage-handling capabilities of such bipolar devices. It is evident, of course, that the provision of vertical PNP transistors in addition to traditional vertical NPN transistors, which are easier to construct, would be extremely useful. However, N well CMOS processes do not easily lend themselves to building isolated vertical PNP devices. In fact, isolated vertical PNP transistors have not been commonly constructed in conventional bipolar processes that use N type epitaxially grown silicon.

As a result, when a PNP transistor is needed in N well processes, designers frequently construct isolated lateral PNP transistors. Isolated lateral PNP transistors, however, have many disadvantages. Commonly, for example, isolated lateral PNP transistors have a low $F_t$ due to the long base widths dictated by the lithography used in the device manufacturing process. Isolated lateral PNP transistors also commonly have an early onset of high-current injection due to lightly doped base regions when the N well diffusion serves as the base. Finally, isolated lateral PNP transistors generally require a relatively high ratio of device size to substrate area. Historically, the lack of a suitable PNP transistor has hampered analog designs, resulting in elaborate schemes to shield the slow, isolated, lateral PNP transistors from the signal path. This was sometimes possible, but in many instances it was not.

Despite the trend toward construction of lateral PNP transistors when they are needed, vertical, or substrate, PNP transistors generally can be constructed in N well BiCMOS processes. However, they are typically formed in a common collector form, which greatly limits their applicability. Furthermore, it is undesirable in most BiCMOS processes to have large substrate currents present, which would certainly be the case with substrate PNP transistors. Such substrate currents can lead to debiasing effects, increasing the potential for latchup. Thus, the lack of a suitable PNP transistor has resulted in an effective inability to merge high performance analog circuitry with digital logic, a critical requirement as the push toward mixed-signal system chips accelerates.

Of course many semiconductor integrated circuit processes are quite complicated, involving the use of many masks and many process steps. It is therefore important to minimize as much as possible the number of masks and process steps necessary to fabricate a complete device, as each additional step or mask has a tendency to reduce the yield and reliability of final circuits.

SUMMARY OF THE INVENTION

In light of the above, therefore, it is an object of the invention to provide an improved process for making a vertical transistor.

It is still another object of the invention to provide a process for making a vertical transistor that does not require undue additional masks or process steps.

It is yet another object of the invention to provide an improved process for making a vertical PNP transistor.

It is still yet another object of the invention to provide a vertical transistor made by an improved process of the type described.

It is another object of the invention to provide an improved PNP transistor that can be constructed using processes based upon a standard N well CMOS process.

It is another object of the invention to provide an improved PNP transistor that can be constructed in conjunction with BiCMOS, LinCMOS™, or LinBiCMOS™, or similar processes.

It is another object of the invention to provide an isolated vertical PNP transistor, and method for making same, which is formed in a P type epitaxial silicon layer isolated by a surrounding N type diffused layer.

These and other objects, features and advantages of the invention will be apparent to those skilled in the art from the following detailed description of the invention, when read in conjunction with the accompanying drawings and appended claims.

In accordance with a broad aspect of the invention, a process for making a vertical transistor on a highly doped semiconductor substrate of a first conductivity type is presented. The process includes epitaxially growing a first lightly doped layer of semiconductor material of the first conductivity type on a surface of the substrate. A buried layer impurity of a second conductivity type is introduced into a surface region of the first lightly doped layer that will underlie the vertical transistor. A second layer of lightly doped semiconductor material of the first conductivity type is epitaxially grown on the first lightly doped layer and the buried layer impurity. An isolation impurity is diffused into the second layer to laterally enclose an island of the second layer above the buried layer impurity. A base impurity of the second conductivity type is diffused into a base region of the enclosed region of the second layer of lightly doped semiconductor material, and an emitter impurity of the first conductivity type is diffused into an emitter region within the base region. The first conductivity type may be P type, such as created with a boron dopant, and the second conductivity type may be N type, such as created by a phosphorus or antimony dopant, wherein the vertical transistor is a vertical PNP transistor.

In one embodiment, a collector resistivity adjusting impurity is diffused into the second layer of semiconductor material prior to the step of diffusing the base impurity. In another embodiment, a surface region of the first conductivity type is implanted in the second layer of semiconductor material to contribute to isolating the base and emitter impurities within the second layer of semiconductor material and increasing the voltage handling capabilities of the resulting transistor.

Various steps in the construction of the vertical PNP transistor, such as the steps of diffusing an isolation impurity, diffusing a base impurity, and diffusing an emitter impurity process, may be performed simultaneously with corresponding steps of a BiCMOS process. In one embodiment, for example, the step of forming a tunnel diode for charge transfer to a floating gate of an EEPROM device may be performed at the same time as the step of diffusing a base impurity in the construction of the vertical PNP device.

According to another broad aspect of the invention, a process is presented for making a vertical transistor on a highly doped semiconductor substrate of a first conductivity type. The process includes forming a first lightly doped layer of semiconductor material of the first conductivity type on a surface of the semiconductor substrate. A first mask is formed to expose an implant region on a surface of the first layer of semiconductor material that will underlie the vertical transistor. A buried layer impurity of second conductivity type is implanted and diffused into the implant region of the first layer of semiconductor material. The first mask is then removed. A second layer of lightly doped semiconductor material of the first conductivity type is formed on the surface of the first lightly doped layer of semiconductor material and on the buried layer, and a second mask is formed to expose a base region on a surface of the second layer of semiconductor material. A base impurity of the second conductivity type is implanted and diffused into the exposed base region. The second mask is then removed. A third mask is formed to expose an emitter region on the surface of the second layer of semiconductor material within the base region. An emitter impurity of the first conductivity type is implanted and diffused into the exposed emitter region, and the third mask is removed.

The transistor is preferably a PNP transistor. In the construction of a PNP transistor, the step of implanting an emitter impurity of the second conductivity type into the exposed emitter region may be performed by implanting boron, and the step of implanting a base impurity of the second conductivity type into the exposed well region may be performed by implanting arsenic, phosphorus, or antimony.

In one embodiment, a collector resistivity adjusting impurity, such as boron, may be diffused into the second layer of semiconductor material prior to the step of diffusing the base impurity. Additionally, a surface region of the first conductivity type in the second layer of semiconductor material may be implanted with an impurity to contribute to isolating the base and emitter impurities within the second layer of semiconductor material.

The process may be performed at least as a portion of a BiCMOS process simultaneously with the steps of diffusing a base impurity and diffusing an emitter impurity, and, more particularly, the BiCMOS process may include the step of forming an EEPROM device having a tunnel diode for charge transfer to a floating gate, wherein the step of diffusing a base impurity is performed simultaneously with a tunnel diode diffusion.

In accordance with another broad aspect of the invention, an isolated vertical transistor made by the foregoing process is presented.

In yet another broad aspect of the invention, a process for making a vertical transistor on a highly doped semiconductor material of a first conductivity type is presented. The method includes forming a first lightly doped layer of semiconductor material of the first conductivity type on a surface of the semiconductor material. An isolation impurity of second conductivity type is implanted and diffused into an isolation region that will underlie a completed vertical transistor. A second layer of lightly doped semiconductor material of the first conductivity type is then formed on the surface of the first lightly doped layer to encapsulate the isolation impurity, and a channel stop isolation region is formed from a surface of the second layer to the isolation region to encompass a portion of the second layer to provide an island of the second layer, which is isolated from the first layer. A vertical transistor, for example, an isolated vertical PNP transistor, is then formed in the isolated portion of the second layer.

According to still another broad aspect of the invention, a method is presented for making a vertical PNP transistor. The method includes forming a first P type epitaxial layer on a P type substrate, and implanting a first N type impurity in a region under which the PNP transistor is to be formed. A second P type epitaxial layer is formed on the first P type epitaxial layer and a second N type impurity is implanted into a region laterally surrounding the region in which the PNP transistor is to be formed. The first and second N type impurities are diffused into the epitaxial layers to a sufficient extent to completely surround a region of the first P type epitaxial layer. A third N type impurity is implanted and diffused into the completely surrounded region to provide a base region for the PNP transistor. A second P type impurity is implanted into the base region, and is diffused into the base region to provide an emitter region for the PNP transistor. If desired, the steps of implanting and diffusing the third N type impurity into the completely surrounded region may be performed simultaneously with implanting and diffusing steps in an associated BiCMOS semiconductor construction process, for example a BiCMOS construction process that includes the formation of at least a portion of an EEPROM device having a tunnel diode region.

In yet another broad aspect of the invention, a vertical PNP transistor is presented that is constructed on a substrate of P type conductivity. The transistor has a P type epitaxial collector region at a surface of the substrate and an N type diffused isolation region completely surrounding the epitaxial collector region. An N type diffused base region exists in the collector region, and a P type diffused emitter region exists in the base region.

BRIEF DESCRIPTION OF THE DRAWING

The invention is illustrated in the accompanying drawing, in which:

FIGS. 4a and 4b are cross sectional drawings of a portion of an integrated circuit in which a few device structures that are typically found in many BiCMOS processes are illustrated in combination with a vertical PNP transistor constructed in accordance with the invention to show some of the process steps that may be simultaneously performed.

FIG. 5 is a cross sectional drawing of a portion of an integrated circuit showing an isolated vertical PNP transistor, without a collector resistivity implant in accordance with another preferred embodiment of the invention, in which a donor impurity has been introduced adjacent the base region to improve the voltage handling capability of the PNP transistor.

And FIGS. 6a and 6b cross sectional drawings of a portion of the integrated circuit of FIG. 5 showing the performance of preliminary surface doping and counter doping to selectively dope the upper portion or surface region of the epitaxial collector of the PNP transistor, according to the invention.

In the various figures of the drawings, which are not necessarily drawn to scale, like reference numerals are used to denote like or similar parts.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Figure 1A:
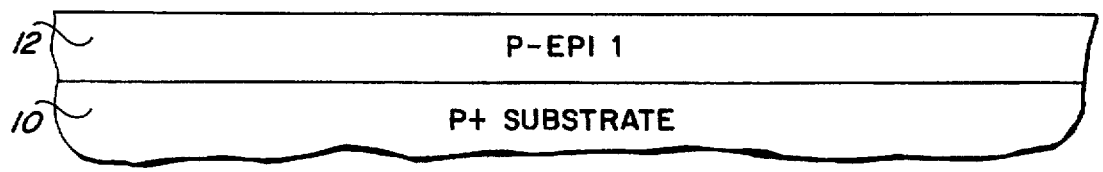
FIGS. 1a–1h are cross sectional side views of a portion of an integrated circuit, showing the sequence of fabrication steps in the construction of an isolated vertical PNP transistor, in accordance with a preferred embodiment of the invention.

According to a preferred embodiment of the invention, a process is presented for making a vertical transistor, and in particular, a vertical PNP transistor in a doped semiconductor substrate of first conductivity type. The steps in the process are illustrated in sequence in FIGS. 1a–1h, which are cross sectional side views of a portion of an integrated circuit. The resulting vertical PNP transistor is shown in FIG. 1h.

The process for making the vertical PNP transistor may be, and is preferably performed in conjunction with a typical process for making mixed-signal BiCMOS structures. Thus, in a typical process for making mixed-signal BiCMOS structures, a silicon semiconductor substrate 10 is provided, which has been heavily doped with an acceptor impurity, such as boron, or the like, to have a P+ type conductivity, as shown in FIG. 1a. In a typical CMOS or BiCMOS process, a first layer 12 of semiconductor material that has been lightly doped with a donor impurity to have a P− conductivity type is epitaxially grown on a surface of the semiconductor substrate 10.

In a typical BiCMOS process, often a second lightly doped layer 16 (described in conjunction with FIG. 1c below) is formed on the first layer 12. However, prior to the formation of the second lightly doped layer 16, in order to provide an isolation tank or region into which the vertical PNP transistor of the invention can be fabricated, a highly doped N type buried isolation region 18 (sometimes called a DUF layer) is formed in the first P type epitaxial layer 12. The DUF layer 18 will horizontally underlie the final PNP transistor structure to isolate a portion of the upper epitaxial layer 16, which will subsequently be formed, from the lower or bottom epitaxial region provided by the first epitaxial layer 12 and the substrate 10.

Figure 1B:
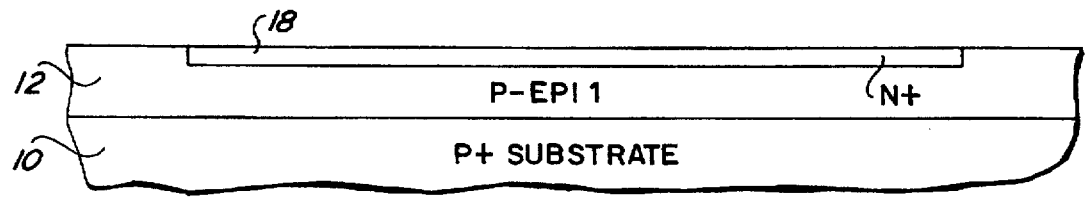

The DUF layer 18 may be formed by implanting a high concentration of a donor impurity, such as antimony, into a masked region (mask not shown) of the first epitaxial layer 12, as shown in FIG. 1b. Then, an initial DUF diffusion is performed, partially driving the DUF impurity into the first eptiaxial layer 12.

Figure 1C:
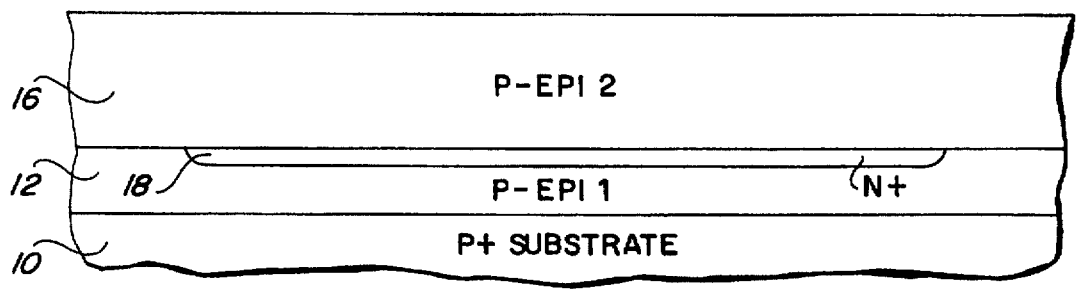

The second epitaxial layer 16 is then formed over the first epitaxial layer 12 and the partially diffused DUF region, as shown in FIG. 1c. The second epitaxial layer is lightly doped with an acceptor type impurity, such as boron, during its epitaxial growth to present an impurity level of about $2 \times 10^{15}$ atoms/cm$^3$ to provide a layer having a P− type conductivity.

Figure 1D:
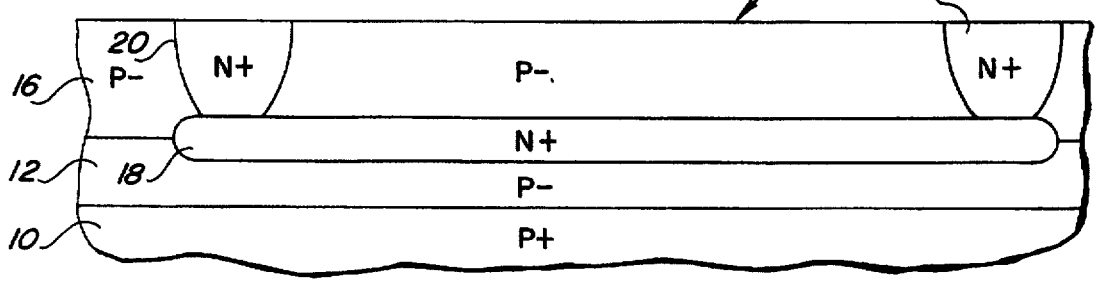

Following the formation of the second epitaxial layer 16, N+ wells 20 and 21 are formed to completely laterally isolate an island or tank region 22 of the upper epitaxial layer 16 in which the vertical PNP transistor will be formed. The N+ wells 20 and 21 may be formed by implanting the well regions with a high concentration level of a donor impurity, such as phosphorus, followed by a sufficient impurity drive in to drive the N type impurity ions to the underlying DUF region 18. (It should be noted that although two N+ wells 20 and 21 appear in the drawings, the physical configuration of the N+ well preferably would be a single region encircling or encompassing the interior semiconductor island, the two N+ well extents that intersect the cross-sectional view of the drawings only appearing as separate N+ well structures.) During the drive in of the N+ well impurity, the underlying DUF region 18 will also be driven beyond the extents of its initial drive in and into the upper epitaxial layer 16 and further into the lower epitaxial layer 12, so that, properly done, the DUF region 18 and the N+ well diffusions 20 and 21 join to completely isolate the island region 22 of the second epitaxial layer 16, as shown in FIG. 1d.

Figure 1E:
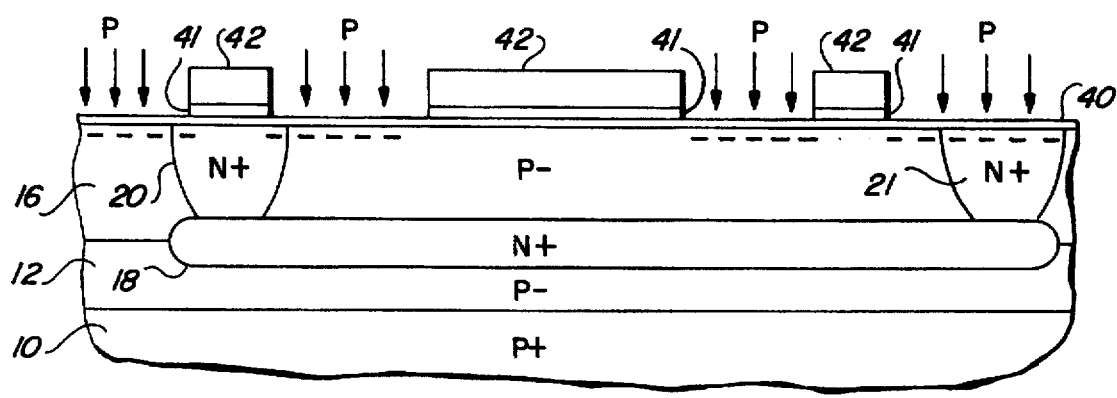
Figure 1F:
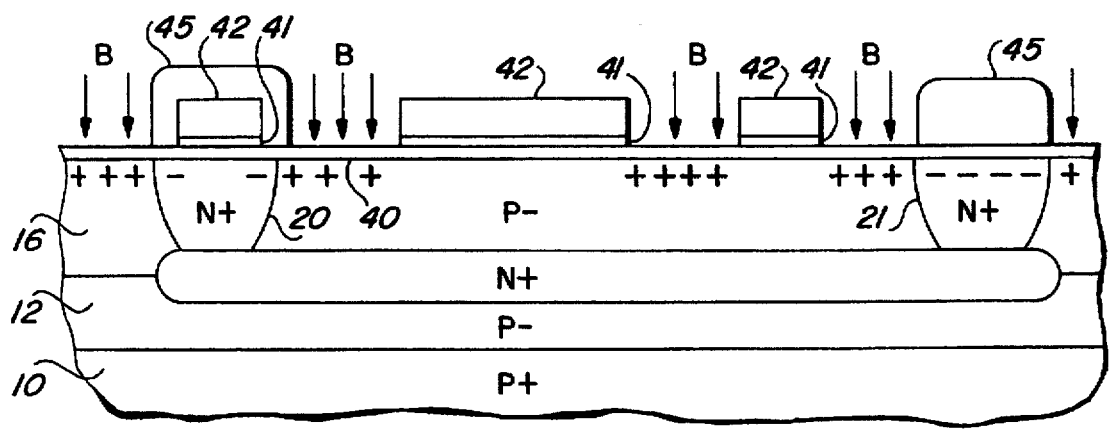

One or more collector resistivity adjusting impurities may optionally be implanted and diffused into the second epitaxial layer 16 prior to the next the step of diffusing the base impurity. One method by which such impurities may be implanted is shown in FIGS. 1e and 1f, which, as mentioned may be optionally performed as a part of the fabrication process by which the vertical PNP transistor of the invention is constructed. The process may be, for instance, a part of a standard LOCOS technique for field oxidation and implants. Thus, as shown in FIG. 1e, the first step may be to form a layer of pad oxide 40 overall. Next, a layer of nitride 41 is formed, followed by a layer of photoresist 42. The photoresist layer 42 and the nitride layer 41 are patterned, essentially in an "inverse moat" pattern that defines the inverse layout of the features of the desired final PNP transistor. At this point, a donor impurity, such as phosphorous, is implanted into the areas of the epitaxial layer 16 exposed by the patterned nitride 41 and photoresist 42. A second layer of photoreisist 45, shown in FIG. 1f, may then be formed over selected lower level photoresist/nitride features, or over the surface of the epitaxial layer 16 itself. Thus, for example, a second layer 45 of resist may be placed over the first layer of resist 42 and nitride 41 over the left N+ well 20, and entirely over the right N+ well 21. An acceptor impurity, such as boron, is then implanted into the exposed areas, counter doping the previously implanted donor impurity in common exposed regions, to become predominately P type. In regions that are masked by the second photoresist layer 45, on the other hand, the originally implanted donor impurity is seen, such as at the surface of the N+ well 21 and at the peripheral region of the surface of the N+ well 20. The resist layers 42 and 45, the nitride layer 41, and the pad oxide layer 40 are then removed.

Figure 3:
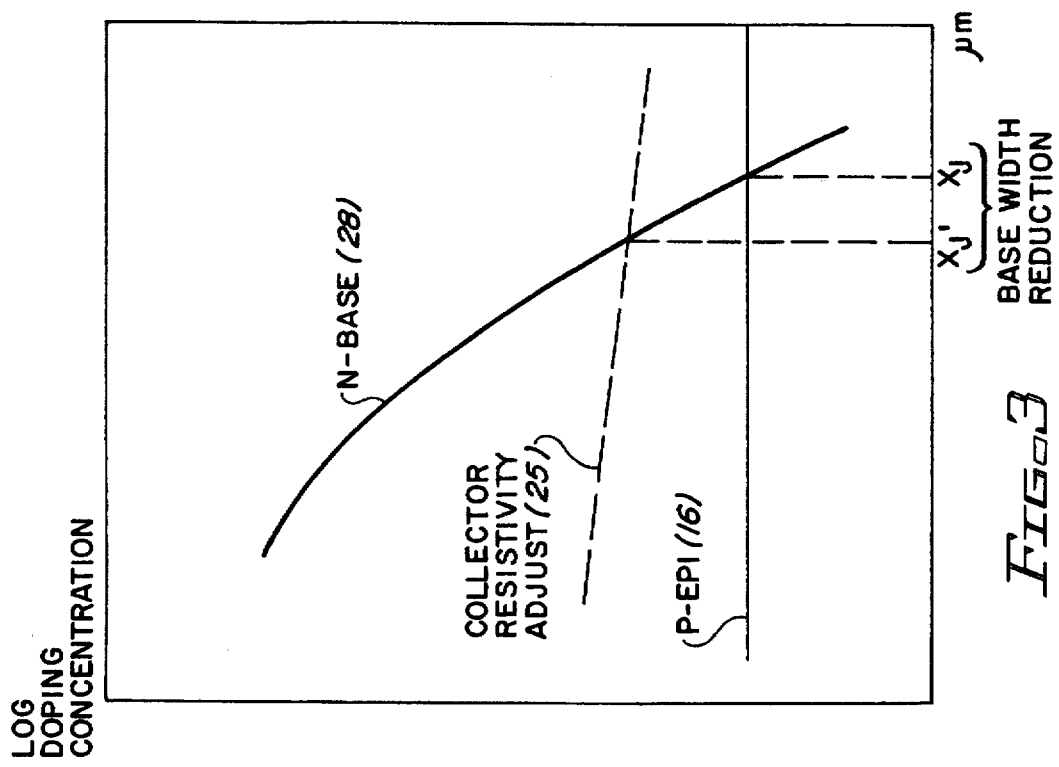
FIG. 3 is an enlarged portion of the graph of FIG. 2, showing the effects of a collector resistivity adjusting implant on the base width of a resulting PNP transistor, in accordance with one aspect of a preferred embodiment of the invention.
Figure 2:
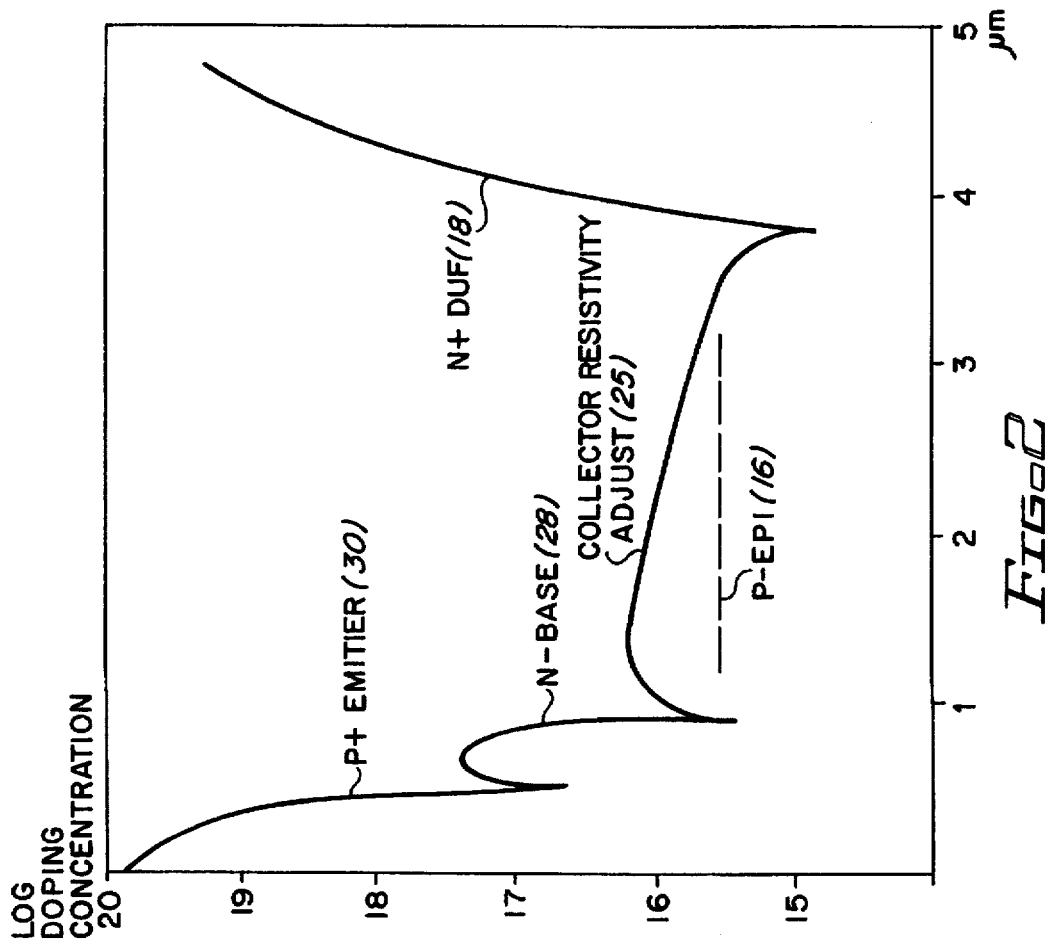
FIG. 2 is a graph taken at B—B in FIG. 1h showing a doping concentration profile as a function of depth into a vertical PNP transistor from its surface, in accordance with a preferred embodiment of the invention.

The introduction of the resistivity adjusting implant may be desirable in some applications because of the high collector resistance that may exist due to the epitaxial layer 16 being only lightly doped. (In some cases, such boron implant may be performed as a part of a concurrently performed BiCMOS process step, such implant often being used, for instance, to increase the operating voltage of NPN transistors which also might be fabricated in some applications. An example of such process can be seen, for example, in U.S. Pat. No. 4,855,244, assigned to the assignee hereof and incorporated herein by reference.) One effect of the resistivity adjusting implant is to raise the doping level in the top several microns of the second epitaxial layer 16. As a result, the collector resistance of the PNP transistor will be reduced, and, in addition, the base width of the PNP transistor will be reduced, as can be seen from the graph of FIG. 3. The reduction in the width of the PNP transistor will result in a device with increased $H_{fe}$ and $F_r$.

Figure 1G:
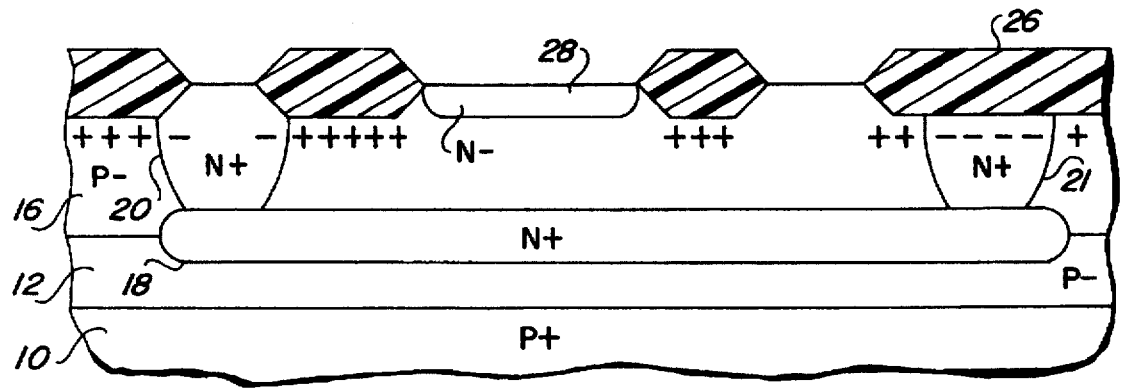
Figure 1H:
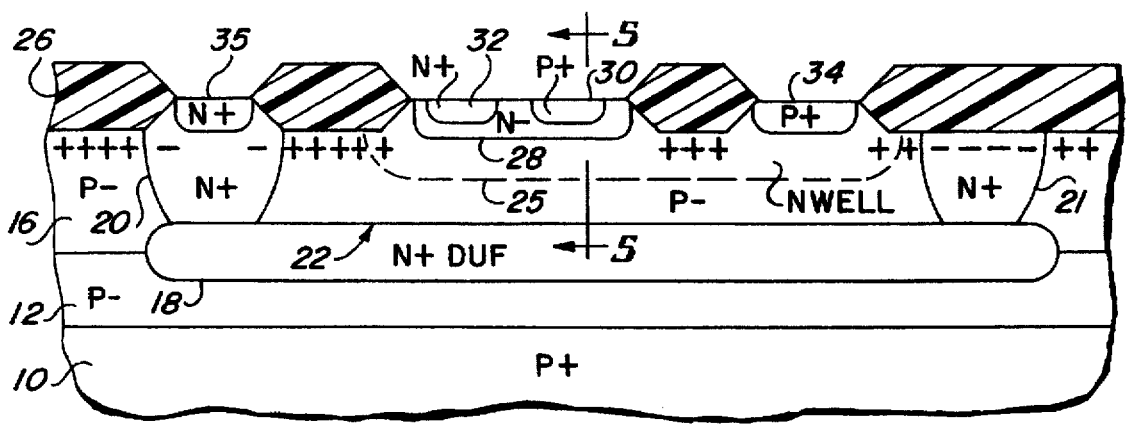

An isolation layer, which may conveniently be a field oxide layer 26 shown in FIG. 1g, may then be formed and patterned for the body and contact regions of the PNP transistor. Then, an N type base impurity is diffused into the tank or island 22 in the top epitaxial layer over the substrate to form the base region 28. The base impurity may be a donor impurity such as arsenic, antimony, or phosphorus. It should be noted that if the vertical PNP structure of the invention is constructed in conjunction with other BiCMOS structures, for example, structures involving tunnel diodes, or the like, the N type base impurity diffusion may also be used to form a tunnel diode region of such other structures, if desired.

After the formation of the base region 28, a P type emitter impurity 30 may be implanted and diffused into the base region to form the P+ emitter of the vertical PNP transistor, as shown in FIG. 1h. The emitter impurity may be an acceptor impurity such as boron. Concurrently, a P+ collector contact region 34 also may be formed. Then, a donor type impurity may be implanted into regions 32 and 35 to provide an N+ base contact, and to afford an N+ DUF contact to enable the DUF and N+ wells, which underlie and surround the transistor structure, to be reverse biased, if desired, to assist in maintaining the isolation of the PNP device. It is noted that the N+ base contact region 32 may be also simultaneously performed with a source/drain implant/ diffusion of an associated NMOS transistor, if the PNP transistor is being constructed as a part of a BiCMOS process.

As mentioned, it will be appreciated that since the processes for forming the various elements of the vertical PNP transistor may be similar to steps of a typical CMOS process, the steps for forming the vertical PNP transistor may be performed simultaneously during at least a portion of some BiCMOS processes if those processes have appropriate corresponding device structures. The cross sections of a few typically formed BiCMOS device structures are shown in FIGS. 4a and 4b, juxtaposed with a vertical PNP transistor constructed in accordance with the invention. In the structure illustrated in FIG. 4a, for example, a standard isolated vertical PNP transistor 60 is shown fabricated in the same isolated island 61 as an isolated vertical PNP transistor 63 that has a collector resistivity implant 64 underlying its base. The collector resistivity implant is labeled "N well adj", since the implant may be performed, for example, concurrently with an N well adjust implant 68 in the formation of a high voltage NPN transistor 70. A standard vertical NPN transistor 71, which does not include an N well adjust implant, is shown adjacent the high voltage NPN transistor 70 for reference. Also, the base diffusion is labeled "tunnel", since it can be performed concurrently with the formation of the tunnel implant and diffusion of the tunnel region of an accompanying EEPROM device 74.

Furthermore, the steps of forming the highly doped N type buried isolation regions 80 which underlie the islands in which the vertical PNP and NPN transistors are constructed can be simultaneously performed. Also, the implant and diffusion of the emitter impurity 82 of the vertical PNP transistor may be performed simultaneously with the formation of the source and drain regions 83 and 84 of an accompanying PMOS transistor 85 and an implant into regions 88 and 89 in base regions 91 and 93 for the respective high and low voltage NPN transistors 70 and 71. An NMOS transistor 86 is shown adjacent the PMOS transistor 85 for reference.

According to another preferred embodiment of the invention, as shown in FIG. 5, an isolated vertical PNP transistor 90, which does not include a collector resistivity adjusting implant, is shown. A donor impurity 92, such as phosphorus, is implanted or introduced adjacent the base region 94 to improve the voltage handling capability of the PNP transistor. It has been found, for example, that in an embodiment of a PNP transistor that has a voltage handling capability of about 25 volts, such implant can improve the voltage handling capability of the resulting PNP transistor to about 80 volts. The implant 92 can be accomplished, for example, by appropriate masking to define an area slightly larger than the area of the PNP transistor, during similar implantation of a donor impurity into the N well regions 98. Alternately, the doping may be accomplished by a blanket implant of the channel stop for N wells 98, followed by a counter doping implant with an acceptor impurity 99 in masked areas away from the region of the vertical PNP transistor 90.

One way by which the surface dopant may be implanted is by a process similar to that described above with reference to FIGS. 1e and 1f, as now shown in FIGS. 6a and 6b. With reference first to FIG. 6a, the structure of FIG. 5, before the formation of the surface oxidation and device elements is first coated with a layer of pad oxide 110 overall. A layer of nitride 111 and photoresist 112 are then also formed overall. The nitride 111 and photoresist 112 are then patterned in an "inverse moat" pattern, to expose the areas that will surround the features of the PNP transistor, and other areas desired to be implanted. As shown, a donor impurity, such as phosphorus, is implanted into the exposed areas.

Next, a second layer of photoresist 115 is selectively patterned over various desired features created by the first layer of photoresist 112 and nitride 111. For example, as shown in FIG. 6b, the first layer 112 of photoresist and its accompanying underlying nitride layer 111 over the region 120 of the base of the transistor, over the region 122 of the left N+ well 123 and entirely over the region 125 of the right N+ well 126 may be covered with the patterned second layer of photoresist 115. Then, an acceptor impurity, such as boron, may be implanted into the exposed regions, counter doping the regions previously doped with the donor impurity, leaving the N channel stop regions adjacent the base of the transistor, the N surface regions of the right N+ well 126, and the N surface peripheral regions of the N+ well 123. The remaining exposed regions are P type. The pad oxide 110, nitride layer 112, and the first and second photoresist layers 112 and 115 are then removed.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A process for making a vertical PNP transistor, comprising the steps of:

forming a highly doped N type buried isolation region in a P type semiconductor substrate to vertically isolate a top portion of said substrate from a bottom portion of said substrate by diffusing a N type impurity into a buried portion of said substrate;

forming a highly doped N type isolation region to encompass and laterally isolate said top portion of said substrate;

diffusing a N type base impurity into said encompassed top portion of said substrate to form a base region;

diffusing a P type emitter impurity into said base region to form an emitter region and, wherein said step of diffusing an N type impurity into a buried portion of said substrate comprises:

forming a first lightly doped layer of P type semiconductor material on a surface of a highly doped P type underlying substrate on said bottom portion of said substrate, introducing a N type buried layer impurity into a surface region of said first lightly doped layer, forming a second lightly doped layer of P type semiconductor material on said first lightly doped layer and said buried layer impurity to provide said top portion of said substrate, and diffusing said N type buried layer impurity into said first and second lightly doped layers of P type semiconductor material; and diffusing a P type collector resistivity adjusting impurity into a second lightly doped layer prior to the step of diffusing the base impurity.

2. The process of claim 1, wherein said steps of forming the first and second lightly doped layer of P type semiconductor material on a surface of a highly doped P type underlying substrate comprises epitaxially growing said first and second layers.

3. The process of claim 1, wherein said step of diffusing a base impurity comprises diffusing antimony into said second layer.

4. The process of claim 1, wherein said step of diffusing an emitter impurity comprises diffusing boron into said second layer.

5. The process of claim 1, further comprising forming base and emitter contact regions to said base and emitter impurities.

6. The process of claim 1, further comprising performing at least a portion of a BiCMOS process simultaneously with said steps of forming the buried isolation region, diffusing the base impurity, and diffusing the emitter impurity.

7. A process for making a vertical PNP transistor, comprising the steps of:

forming a highly doped N type buried isolation region in a P type semiconductor substrate to vertically isolate a top portion of said substrate from a bottom portion of said substrate;

forming a highly doped N type isolation region to encompass and laterally isolate said vertically isolated top portion of said substrate;

diffusing a N type base impurity into said encompassed top portion of said substrate to form a base region;

diffusing a P type emitter impurity into said base region to form an emitter region diffusing a P type emitter impurity into said base region to form an emitter region; and performing at least a portion of a BiCMOS process simultaneously with said steps of forming the buried isolation region, diffusing the base impurity, and diffusing the emitter impurity, wherein said BiCMOS process includes the step of forming an EEPROM having a tunnel diode for charge transfer to a floating gate, and wherein said step of diffusing the base impurity is performed simultaneously with a tunnel diode diffusion.

8. A process for making a vertical transistor on a highly doped semiconductor substrate of first conductivity type, comprising:

epitaxially growing a first lightly doped layer of semiconductor material of said first conductivity type on a surface of said semiconductor substrate;

introducing a buried layer impurity of second conductivity type into a surface region of said first lightly doped layer of semiconductor material that will underlie the vertical transistor;

epitaxially growing a second layer of lightly doped semiconductor material of said first conductivity type on said first lightly doped layer of semiconductor material and said buried layer impurity;

diffusing an isolation impurity into said second layer of semiconductor material to laterally enclose an island of said second layer of semiconductor material above said buried layer impurity;

diffusing a base impurity of said second conductivity type into a base region of said enclosed region of said second layer of lightly doped semiconductor material;

diffusing an emitter impurity of said first conductivity type into an emitter region within said base region; and diffusing a collector resistivity adjusting impurity into said second layer of semiconductor material prior to said step of diffusing the base impurity.

9. The process of claim 8, wherein said first conductivity type is P type and said second conductivity type is N type.

10. The process of claim 8, wherein said vertical transistor is a vertical PNP transistor.

11. The process of claim 8, wherein said step of diffusing a base impurity comprises diffusing phosphorous into said second layer of semiconductor material.

12. The process of claim 8, wherein said step of diffusing an emitter impurity comprises diffusing boron into said second layer of semiconductor material.

13. The process of claim 8, further comprising forming base and emitter contact regions to said base and emitter impurities.

14. The process of claim 8, further comprising implanting a surface region of said first conductivity type in said second layer of semiconductor material to contribute to isolating said base and emitter impurities within said second layer of semiconductor material.

15. The process of claim 8, further comprising performing a BiCMOS process simultaneously with said steps of diffusing the isolation impurity, diffusing the base impurity, and diffusing the emitter impurity.

16. A process for making a vertical transistor on a highly doped semiconductor substrate of first conductivity type, comprising:

epitaxially growing a first lightly doped layer of semiconductor material of said first conductivity type on a surface of said semiconductor substrate;

introducing a buried layer impurity of second conductivity type into a surface region of said first lightly doped layer of semiconductor material that will underlie the vertical transistor;

epitaxially growing a second layer of lightly doped semiconductor material of said first conductivity type on said first lightly doped layer of semiconductor material and said buried layer impurity;

diffusing an isolation impurity into said second layer of semiconductor material to laterally enclose an island of said second layer of semiconductor material above said buried layer impurity;

diffusing a base impurity of said second conductivity type into a base region of said enclosed region of said second layer of lightly doped semiconductor material;

diffusing an emitter impurity of said first conductivity type into an emitter region within said base region; performing a BiCMOS process simultaneously with said steps of diffusing the isolation impurity, diffusing the base impurity, and diffusing the emitter impurity, wherein said BiCMOS process includes the step of forming an EEPROM having a tunnel diode for charge transfer to a floating gate, and wherein said step of diffusing the base impurity is performed simultaneously with a tunnel diode diffusion.

* * * * *